US007961017B2

(12) United States Patent
Lee

(10) Patent No.: US 7,961,017 B2
(45) Date of Patent: Jun. 14, 2011

(54) DLL CIRCUIT AND METHOD OF CONTROLLING THE SAME

(75) Inventor: Hye Young Lee, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/493,260

(22) Filed: Jun. 29, 2009

(65) Prior Publication Data

US 2010/0171537 A1 Jul. 8, 2010

(30) Foreign Application Priority Data

Jan. 6, 2009 (KR) ........................ 10-2009-0000741

(51) Int. Cl.
*H03L 7/06* (2006.01)

(52) U.S. Cl. ........................................ 327/158; 327/149
(58) Field of Classification Search .................. 327/149, 327/158
See application file for complete search history.

(56) References Cited

U.S. PATENT DOCUMENTS

| 6,853,225 | B2 | 2/2005 | Lee |
| 6,934,215 | B2 | 8/2005 | Chung et al. |
| 6,963,235 | B2 | 11/2005 | Lee |
| 7,199,634 | B2 * | 4/2007 | Cho et al. ...................... 327/175 |
| 7,206,956 | B2 | 4/2007 | Johnson et al. |
| 7,332,948 | B2 | 2/2008 | Park et al. |
| 7,479,816 | B2 * | 1/2009 | Lee et al. ....................... 327/158 |
| 7,548,101 | B2 * | 6/2009 | Shim ............................ 327/175 |
| 7,598,783 | B2 * | 10/2009 | Shin et al. ...................... 327/158 |
| 7,675,337 | B2 * | 3/2010 | Koo ............................... 327/175 |
| 7,710,173 | B2 * | 5/2010 | Shim ............................ 327/158 |
| 7,719,334 | B2 * | 5/2010 | Kwak ............................ 327/158 |
| 7,750,703 | B2 * | 7/2010 | Yun et al. ....................... 327/175 |
| 7,764,096 | B2 * | 7/2010 | Lee et al. ....................... 327/158 |
| 2008/0143404 | A1 | 6/2008 | Shim |
| 2008/0272815 | A1 | 11/2008 | Yeo et al. |
| 2009/0278581 | A1 * | 11/2009 | Yang et al. .................... 327/158 |
| 2009/0322390 | A1 * | 12/2009 | Shim ............................ 327/158 |
| 2010/0109725 | A1 * | 5/2010 | Yun et al. ...................... 327/158 |

FOREIGN PATENT DOCUMENTS

| JP | 2008-154210 | 7/2008 |
| KR | 100701423 B1 | 3/2007 |
| KR | 10-0821577 | 4/2008 |

* cited by examiner

*Primary Examiner* — Lincoln Donovan
*Assistant Examiner* — Adam D Houston
(74) *Attorney, Agent, or Firm* — IP & T Group LLP

(57) ABSTRACT

A delay locked loop (DLL) circuit includes a first feedback loop configured to delay a reference clock signal with a delay line, wherein the first feedback loop is further configured to generate a correction clock signal by correcting a duty cycle of the reference clock signal by adjusting a delay of the delay line; and a second feedback loop configured to generate an output clock signal by detecting a phase of the reference clock signal and delaying the correction clock signal with a delay according to the detection result.

14 Claims, 3 Drawing Sheets

DLL CIRCUIT AND METHOD OF CONTROLLING THE SAME

CROSS-REFERENCES TO RELATED PATENT APPLICATION

The present application claims priority under 35 U.S.C 119(a) to Korean Application No. 10-2009-0000741, filed on Jan. 6, 2009, in the Korean Intellectual Property Office, the disclosure of which is incorporated herein by reference in its entirety as set forth in full.

BACKGROUND

The present invention relates generally to semiconductor integrated circuits (IC) and, more particularly, to a delay locked loop (DLL) circuit included in a semiconductor IC and a method of controlling the same.

A conventional semiconductor IC, such as, synchronous dynamic random access memory (SDRAM), uses a clock signal to increase an operational speed. For this, a typical semiconductor IC includes a clock buffer that buffers an externally input clock signal. In some cases, a semiconductor IC includes a delay locked loop (DLL) circuit or a phase locked loop (PLL) circuit to generate an internal clock signal in which a phase difference between the internal clock signal and the external clock signal has been corrected. With respect to the internal clock signal used in a semiconductor IC, a ratio between a high level interval and a low level interval, i.e., a duty ratio, is preferably maintained at a predetermined ratio of 50:50. However, since the typical semiconductor IC includes numerous delay elements, the duty ratio of the internal clock signal may easily vary.

Due to the high-speed operations of semiconductor ICs, utilization of a clock signal has increased, thus, a clock signal having a stable duty ratio is required. Accordingly, the DLL circuit of each semiconductor IC has a configuration for performing a duty cycle correcting function and an importance of a duty cycle correcting technology using the configuration has increased in order to utilize a stable clock signal in a high-speed operation.

The DLL circuit that performs the duty cycle correcting operation is implemented as a dual loop type. One of two feedback loops performs a delay lock operation and the other performs the duty cycle correcting operation. That is, the first feedback loop includes a replica delayer and a phase detector and controls a phase of an output clock signal by adjusting a delay value of a first delay line, while the second feedback loop controls a duty cycle of the output clock signal by detecting the duty cycle of the output clock signal and adjusting a delay value of a second delay line.

However, the dual loop type DLL circuit includes two delay lines, such that the area occupied thereof increases. Actually, the second delay line that performs the duty cycle correcting operation has a variation of the delay value smaller than the first delay line that performs the delay lock operation. However, it is not easy that the first delay line and the second delay line are configured to have different total delay values from each other in the above-mentioned structure. As the semiconductor IC is implemented with high integration, the area occupied by the DLL circuit being large as described above is recognized as a concern to be addressed.

SUMMARY

Aspects of the present invention include a delay locked loop (DLL) circuit and a method of controlling the same that can improve area efficiency by reducing an occupancy area are disclosed herein.

In one aspect, a delay locked loop (DLL) circuit includes a first feedback loop configured to delay a reference clock signal with a delay line, wherein the first feedback loop is further configured to generate a correction clock signal by correcting a duty cycle of the reference clock signal by adjusting a delay of the delay line; and a second feedback loop configured to generate an output clock signal by detecting a phase of the reference clock signal and delaying the correction clock signal with a delay according to the detection result.

In another aspect, a delay locked loop (DLL) circuit includes a first sub delay line configured to generate a first delay clock signal by delaying a reference clock signal with a fixed delay; a second sub delay line configured to generate a second delay clock signal by delaying the reference clock signal with a variable delay for adjusting a duty cycle of the reference clock signal; a duty cycle correcting unit configured to generate a correction clock signal by combining the first delay clock signal and the second delay clock signal; and a main delay line configured to generate a third delay clock signal by delaying the correction clock signal with the variable delay for performing a delay locking operation with respect to the correction clock signal.

In still aspect, a method of controlling a delay locked loop (DLL) circuit includes generating a correction clock signal by delaying a reference clock signal using first and second delay lines; adjusting a delay of the second delay line by detecting a duty cycle of the correction clock signal; regenerating the correction clock signal by combining clock signals output from the first and second delay lines; and generating the output clock signal by performing a delay locking operation with respect to the correction clock signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
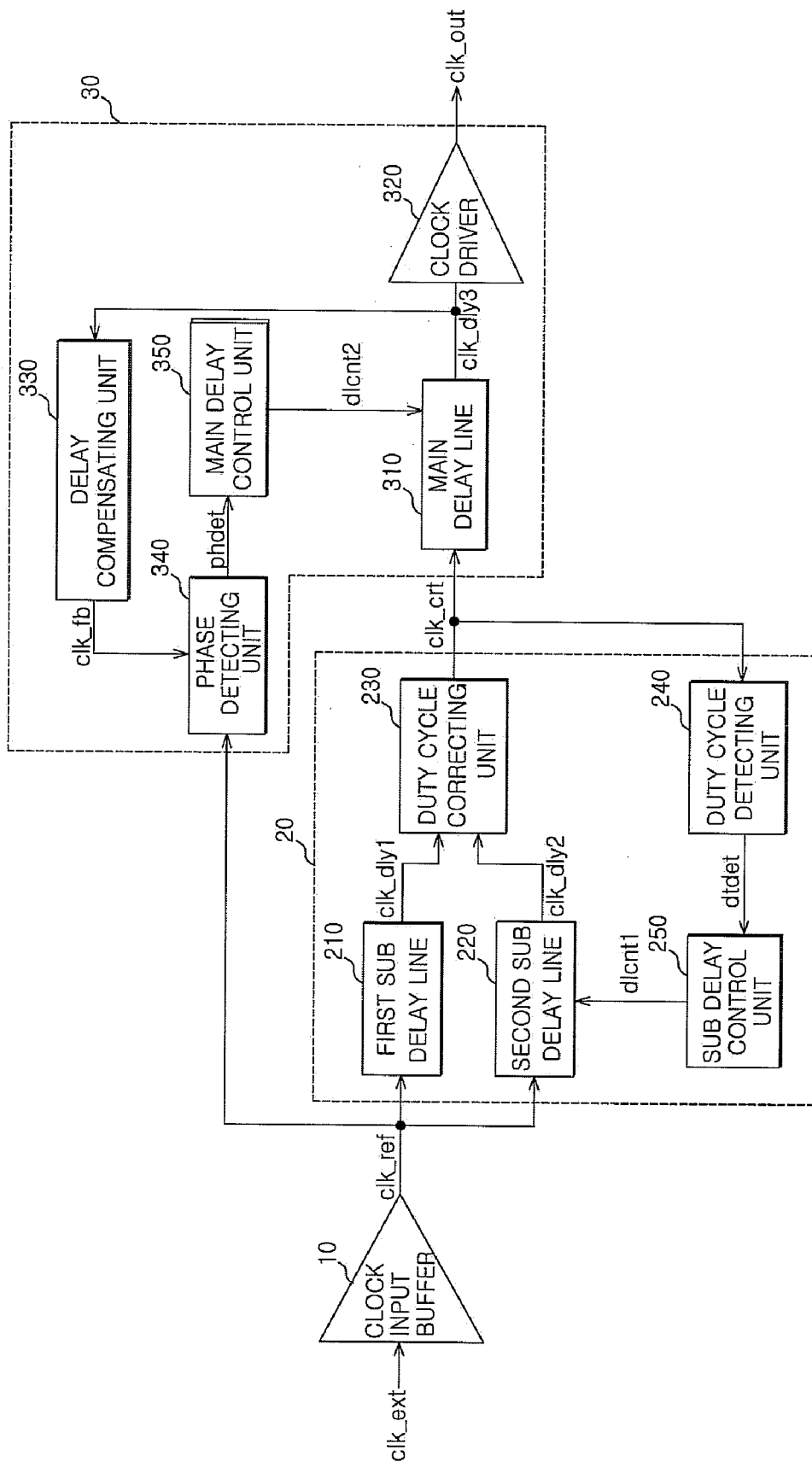
FIG. 1 is a schematic block diagram showing the configuration of an exemplary DLL circuit according to one embodiment of the present invention.

FIG. 1 is a schematic block diagram showing the configuration of an exemplary DLL circuit according to an embodiment of the present invention.

As shown in the figure, the DLL circuit can include a clock input buffer 10, a first feedback loop 20, and a second feedback loop 30.

The clock input buffer 10 can generate a reference clock signal 'clk_ref' by buffering an external clock signal 'clk_ext'.

The first feedback loop 20 can generate a correction clock signal 'clk_crt' by correcting a duty cycle of the reference clock signal 'clk_ref' using two delay lines. For this, the first feedback loop 20 detects a duty cycle of the correction clock signal 'clk_crt' and adjust delay values of two delay lines according to the detection result. The first feedback loop 20 can include a first sub delay line 210, a second sub delay line 220, a duty cycle correcting unit 230, a duty cycle detecting unit 240, and a sub delay control unit 250.

The first sub delay line 210 can generate a first delay clock signal 'clk_dly1' by delaying the reference clock signal 'clk_ref' by a fixed delay value. The second sub delay line 220 can generate a second delay clock signal 'clk_dly2' by delaying the reference clock signal 'clk_ref' by a variable delay value for adjusting the duty cycle of the reference clock signal 'clk_ref'.

The second sub delay line 220 performs the delay operation after receiving and inverting the reference clock signal 'clk_ref'. When the reference clock signal 'clk_ref' transmitted from the clock input buffer 10 is implemented in the form of a clock pair, the first sub delay line 210 and the second sub delay line 220 can receive a positive reference clock signal and a negative reference clock signal, respectively. That is, the first sub delay line 210 and the second sub delay line 220 perform delay operations with respect to clock signals that have phases opposite to each other. Therefore, in an ideal case, the first delay clock signal 'clk_dly1' and the second delay clock signal 'clk_dly2' have a phase difference of a half cycle.

The duty cycle correcting unit 230 can generate the correction clock signal 'clk_crt' by combining the first delay clock signal 'clk_dly1' and the second delay clock signal 'clk_dly2'. The duty cycle correcting unit 230 can be implemented as an edge trigger type. That is, the duty cycle correcting unit 230 sets a voltage level of the correction clock signal 'clk_crt' to a first level (for example, high level) at a rising edge of the first delay clock signal 'clk_dly1' and sets the voltage level of the correction clock signal 'clk_crt' to a second level (for example, low level) at a rising edge of the second delay clock signal 'clk_dly2'. A configuration of the duty cycle correcting unit 230 can be easily implemented by a person of ordinary skill in the art. In the above-described manner, the duty cycle correcting unit 230 combines the first delay clock signal 'clk_dly1' having a fixed phase and the second delay clock signal 'clk_dly2' having a variable phase by using the above-mentioned scheme, such that the correction clock signal 'clk_crt' can have a duty ratio of 50:50.

The duty cycle detecting unit 240 can generate a duty detection signal 'dtdet' by detecting the duty cycle of the correction clock signal 'clk_crt'. The duty cycle detecting unit 240 can easily be implemented by a combination of a duty accumulator and a comparator. This is a technology known in the art. That is, although not shown, it is possible to generate the duty detection signal 'dtdet' that indicates whether a high level interval of the correction clock signal 'clk_crt' is wide or narrow by generating two voltages according to the duty cycle of the correction clock signal 'clk_crt' using the duty accumulator and comparing the two voltages using the comparator.

The sub delay control unit 250 can control a delay value of the second sub delay line 220 by generating a first delay control signal 'dlcnt1' in response to the duty detection signal 'dtdet'. The sub delay control unit 250 can include a shift register. The first delay control signal 'dlcnt1' may be implemented as a plurality of bits of digital signal. The sub delay control unit 250 operates in a manner in which a location of a bit having a logic value of "1", which is included in the first delay control signal 'dlcnt1', is shifted according to a voltage level of the duty detection signal 'dtdet'. The second sub delay line 220 may be configured to perform a coarse delay operation and a fine delay operation. If so, the sub delay control unit 250 must include a configuration for controlling the fine delay in addition to the shift register. In this case, the first delay control signal 'dlcnt1' is implemented by a coarse delay control signal and a fine delay control signal.

Herein, a desirable feature is that the first sub delay line 210 and the second sub delay line 220 are each implemented with a very small size in comparison with a known delay line. The first sub delay line 210 and the second sub delay line 220 are provided for the duty cycle correcting operation. Actually, delay values of the sub delay lines do not vary as greatly as the delay value of the delay line performing a delay locking operation.

Meanwhile, the second feedback loop 30 can generate an output clock signal 'clk_out' by detecting a phase of the reference clock signal 'clk_ref' and delaying the correction clock signal 'clk_crt' using a delay value according to the detection result. The second feedback loop 30 can generate a feedback clock signal 'clk_fb' by using a delay value acquired by modeling a delay amount generated by delay elements that are provided on an output path of the output clock signal 'clk_out' and detect the phase of the reference clock signal 'clk_ref' by comparing a phase of the feedback clock signal 'clk_fb' with the phase of the reference clock signal 'clk_ref'. Further, depending on the comparison result, the second feedback loop 30 controls a phase of the output clock signal 'clk_out' by adjusting an amount of a delay time which is granted to the correction clock signal 'clk_crt'. The second feedback loop 30 can include a main delay line 310, a clock driver 320, a delay compensating unit 330, a phase detecting unit 340, and a main delay control unit 350.

The main delay line 310 can generate a third delay clock signal 'clk_dly3' by delaying the correction clock signal 'clk_crt' in response to a second delay control signal 'dlcnt2'. The clock driver 320 can generate the output clock signal 'clk_out' by driving the third delay clock signal 'clk_dly3'. The delay compensating unit 330 can generate the feedback clock signal 'clk_fb' by delaying the third delay clock signal 'clk_dly3' by the delay value acquired by modeling the delay amount generated by the delay elements that are provided on the output path of the output clock signal 'clk_out'. The phase detecting unit 340 can generate the phase detection signal 'phdet' by detecting the phase of the reference clock signal 'clk_ref' and the phase of the feedback clock signal 'clk_fb'. The main delay control unit 350 can control a delay value of the main delay line 310 by generating the second delay control signal 'dlcnt2' in response to the phase detection signal 'phdet'.

In the above-described manner, the second feedback loop 30 is implemented in the form of the general DLL circuit. The main delay line 310 receives the correction clock signal 'clk_crt' of which the duty cycle is corrected in the first feedback loop 20 and performs a delay locking operation with respect to the correction clock signal 'clk_crt'. The main delay control unit 350 variably delays the main delay line 310 in response to a result value acquired by detecting the phase of the reference clock signal 'clk_ref', that is, the phase detection signal 'phdet' generated by comparing the phase of the reference clock signal 'clk_ref' and the phase of the feedback clock signal 'clk_fb'.

As described above, the DLL circuit can perform both the delay locking operation and the duty cycle correcting operation by using one main delay line 310 and two sub delay lines 210 and 220. Herein, in comparison to use of two main delay lines in the related art, it can be understood that the occupancy area of the DLL circuit is reduced. The two sub delay lines 210 and 220 have sizes as large as substantially one-several tenths of the main delay line 310.

Figure 2:
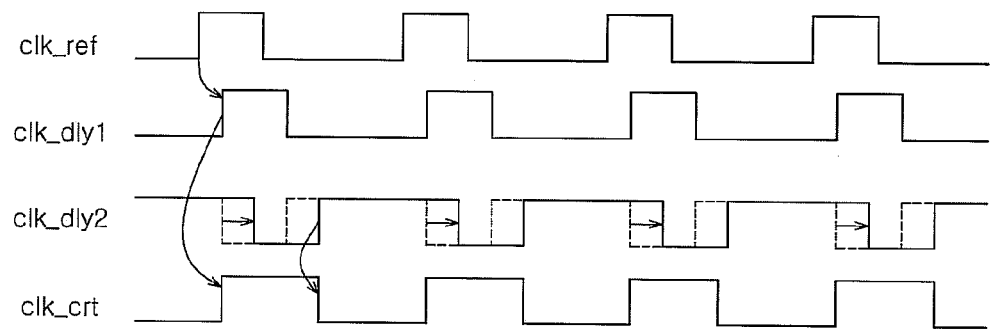
FIG. 2 is a timing diagram illustrating the operation of the exemplary first feedback loop of FIG. 1 according to an embodiment of the present invention.

FIG. 2 is a timing diagram shown for illustrating the operation of the exemplary feedback loop of FIG. 1 according to an embodiment of the present invention. FIG. 2 illustrates a state in which a high level interval of the reference clock signal 'clk_ref' is narrower than a low level interval of the reference clock signal 'clk_ref' as one example.

Referring to FIG. 2, since the first delay clock signal 'clk_dly1' is generated by granting a fixed delay time to the reference clock signal 'clk_ref', the first delay clock signal 'clk_dly1' shows a phase that trails that of the reference clock signal 'clk_ref'. Further, the second delay clock signal 'clk_dly2' has a phase opposite to the first delay clock signal 'clk_dly1'. The phase of the second delay clock signal 'clk_dly2' is adjusted to move in a direction indicated by the arrow by the duty cycle correcting operation.

The correction clock signal 'clk_crt' is generated by the edge triggering operation as described above. The correction clock signal 'clk_crt' may have a duty ratio of 50:50 as shown in the figure by a variable delay with respect to the second delay clock signal 'clk_dly2' and the edge triggering operation of the duty cycle correcting unit 230.

In addition to the above-described features, the operation of the first feedback loop 20 is implemented where the operation is performed with respect to not a clock signal output from the main delay line 310 but a clock signal input into the main delay line 310.

Figure 3:
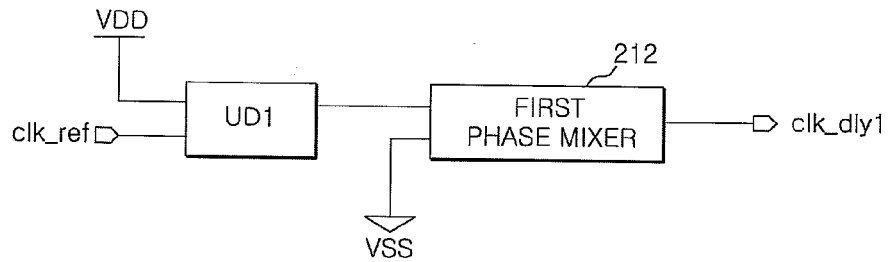
FIG. 3 is a configuration diagram showing an exemplary first sub delay line of FIG. 1 according to an embodiment of the present invention.

FIG. 3 is a configuration diagram showing an exemplary first sub delay line of FIG. 1 according to an embodiment of the present invention.

As shown in the figure, the first sub delay line 210 can include a first unit delayer UD1 and a first phase mixer 212.

The first unit delayer UD1 performs a delay operation for a unit time by receiving an external supply voltage VDD and the reference clock signal 'clk_ref'. The first unit delayer UD1 can be implemented by a combination of serial connection of two NAND gates and two inverters. As such, it is assumed herein that a time during which a predetermined signal passes through four delay elements is one unit time.

The first phase mixer 212 can generate the first delay clock signal 'clk_dly1' by performing a phase mixing operation of an output signal of the first unit delayer UD1 and a ground voltage VSS. The first phase mixer 212 can perform the fine delay operation with respect to the output signal of the first unit delayer UD1 by a plurality of bits of a control signal, but the first phase mixer 212 preferably generates the first delay clock signal 'clk_dly1' by delaying the output signal of the first unit delayer UD1 by the fixable delay value.

Figure 4:
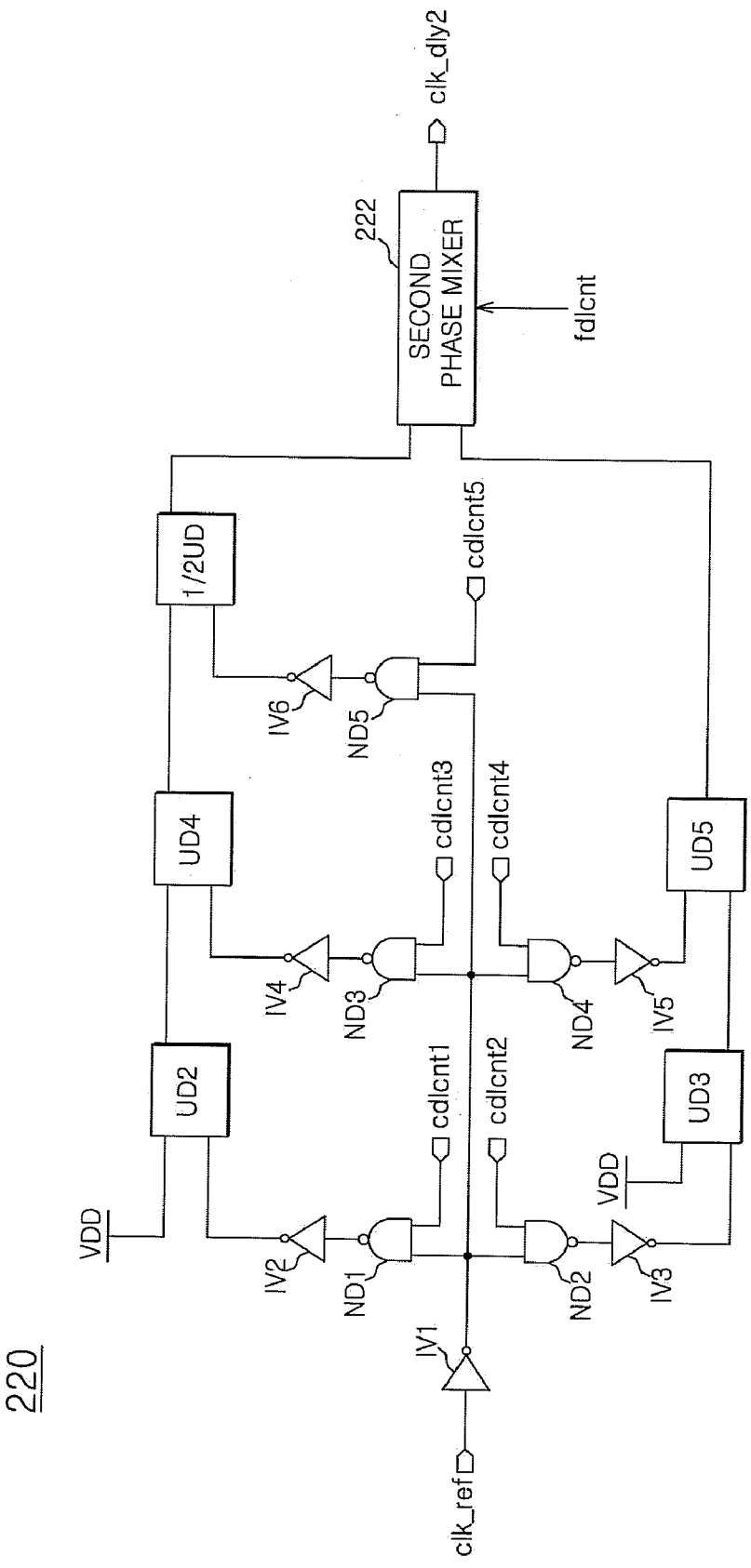
FIG. 4 is a configuration diagram showing an exemplary second sub delay line of FIG. 1 according to an embodiment of the present invention.

FIG. 4 is a configuration diagram showing an exemplary second sub delay line of FIG. 1 according to an embodiment of the present invention. The first delay control signal is constituted by the coarse delay control signal and the fine delay control signal. According to an example, the coarse delay control signal may be a 5-bit digital signal.

As shown in the figure, the second sub delay line 220 can include first to sixth inverters IV1 to IV6, first to fifth NAND gates ND1 to ND5, second to fifth unit delayers UD2 to UD5, a ½ unit delayer ½UD, and a second phase mixer 222.

The first inverter IV1 can receive the reference clock signal 'clk_ref'. The first NAND gate ND1 can receive an output signal of the first inverter IV1 and a first bit 'cdlcnt1' of the coarse delay control signal. The second inverter IV2 can receive an output signal of the first NAND gate ND1. The second NAND gate ND2 can receive the output signal of the first inverter IV1 and a second bit 'cdlcnt2' of the coarse delay control signal. The third inverter IV3 can receive an output signal of the second NAND gate ND2. The third NAND gate ND3 can receive the output signal of the first inverter IV1 and a third bit 'cdlcnt3' of the coarse delay control signal. The fourth inverter IV4 can receive an output signal of the third NAND gate ND3. The fourth NAND gate ND4 can receive the output signal of the first inverter IV1 and a fourth bit 'cdlcnt4' of the coarse delay control signal. The fifth inverter IV5 can receive an output signal of the fourth NAND gate ND4. The fifth NAND gate ND5 can receive the output signal of the first inverter IV1 and a fifth bit 'cdlcnt5' of the coarse delay control signal. The sixth inverter IV6 can receive an output signal of the fifth NAND gate ND5.

The second unit delayer UD2 performs the delay operation by delaying for the unit time in response to the external supply voltage VDD and the output signal of the second inverter IV2. The third unit delayer UD3 performs the delay operation by delaying for the unit time in response to the external supply voltage VDD and the output signal of the third inverter IV3. The fourth unit delayer UD4 performs the delay operation by delaying for the unit time in response to the output signal of the second unit delayer UD2 and the output signal of the fourth inverter IV4. The fifth unit delayer UD5 performs the delay operation by delaying for the unit time in response to the output signal of the third unit delayer UD3 and the output signal of the fifth inverter IV5. The ½ unit delayer ½UD performs the delay operation by delaying for ½ of the unit time in response to the output signal of the fourth unit delayer UD4 and the output signal of the sixth inverter IV6. The second phase mixer 222 can generate the second delay clock signal 'clk_dly2' by performing a phase mixing operation of an output signal of the fifth unit delayer UD5 and an output signal of the ½ unit delayer ½UD in response to the fine delay control signal 'fdlcnt'.

Herein, it is preferable that each unit delayer is the same as the unit delayer UD1 that is disposed in the first sub delay line 210. Accordingly, each of the second to fifth unit delayers UD2 to UD5 has the delay value of the unit time. The ½ delayer ½UD has delay elements as many as ½ of the number of delay elements of the unit delayers. Therefore, the ½ delayer ½UD has a delay value corresponding to ½ of the unit time.

Two bits having a logic value of '1' are successively included in the coarse delay control signal 'cdlcnt1' to 'cdlcnt5'. Further, (0, 0, 1, 1, 0) which is a logic value of the coarse delay control signal correspond to a default value of the coarse delay control signal 'cdlcnt1' to 'cdlcnt5'. When the duty detection signal 'dtdet' instructs the delay value of the second sub delay line 220 to increase, the sub delay control unit 250 shifts bits having the logic value of '1', which are included in the coarse delay control signal 'cdlcnt1' to 'cdlcnt5' to a higher-order bit by one digit. That is, the logic value of the coarse delay control signal 'cdlcnt1' to 'cdlcnt5' are changed from (0, 0, 1, 1, 0) to (0, 1, 1, 0, 0). On the contrary, when the duty detection signal 'dtdet' instructs the delay value of the second sub delay line 220 to decrease, the sub delay control unit 250 shifts bits having the logic value of '1', which are included in the coarse delay control signal 'cdlcnt1' to 'cdlcnt5' to a lower-order bit by one digit. That is, the logic value of the coarse delay control signal 'cdlcnt1' to 'cdlcnt5' is changed from (0, 0, 1, 1, 0) to (0, 0, 0, 1, 1).

Meanwhile, the second phase mixer 222 can generate the second delay clock signal 'clk_dly2' by mixing phases of two input signals in response to the fine delay control signal 'fdlcnt'. The phase of the second delay clock signal 'clk_dly2' can be adjusted more precisely by the fine delay operation of the second phase mixer 222.

As described above, a DLL circuit of the present invention includes two feedback loops configured to perform a delay locking operation and a duty cycle correcting operation, respectively. Unlike the related art, a feedback loop that performs the duty cycle correcting operation is disposed preceding a feedback loop that performs the delay locking operation. Functions of the feedback loops are separated from each other. Therefore, since the feedback loop that performs the duty cycle correcting operation can cope with only a comparatively small change of a delay amount, it is possible to reduce a size of an area occupied by delay lines arranged therein. As such, the area occupied by the DLL circuit can be reduced by implementing the present invention. Consequently, because area efficiency is improved, it is possible to effectively support high integration of a semiconductor IC.

While certain embodiments have been described above, it will be understood to those skilled in the art that the embodiments described are by way of example only. Accordingly, the apparatus described herein should not be limited based on the described embodiments. Rather, the apparatus described herein should only be broadly interpreted to cover the full scope of the claims that follow when taken in conjunction with the above description and accompanying drawings.

What is claimed is:
1. A delay locked loop (DLL) circuit, comprising:
a first feedback loop configured to delay a reference clock signal to generate a first delay clock signal with a first sub delay line having a fixed delay and a second delay clock signal with a second sub delay line having a variable delay, wherein the first feedback loop is further configured to generate a correction clock signal by correcting a duty cycle of the reference clock signal by combining the first and second delay clock signals; and
a second feedback loop configured to generate an output clock signal by detecting a phase of the reference clock signal and delaying the correction clock signal with a delay according to the detection result.
2. The DLL circuit of claim 1, wherein the first feedback loop is configured to detect a duty cycle of the correction clock signal and adjust a delay of the delay line according to the detection result.
3. The DLL circuit of claim 2, wherein
the first feedback loop includes:
the first sub delay line configured to generate the first delay clock signal by delaying the reference clock signal with the fixed delay;
the second sub delay line configured to generate the second delay clock signal by delaying the reference clock signal with the variable delay for adjusting the duty cycle of the reference clock signal;
a duty cycle correcting unit configured to generate the correction clock signal by combining the first delay clock signal and the second delay clock signal;
a duty cycle detecting unit configured to generate a duty detection signal by detecting the duty cycle of the correction clock signal; and
a sub delay control unit configured to control a delay of the second sub delay line by generating a first delay control signal in response to the duty detection signal.
4. The DLL circuit of claim 3, wherein the duty cycle correcting unit is configured to set a voltage level of the correction clock signal to a first level at a rising edge of the first delay clock signal and set the voltage level of the correction clock signal to a second level at a rising edge of the second delay clock signal.
5. The DLL circuit of claim 3, wherein the duty cycle detecting unit is configured to generate two voltages corresponding to the duty cycle of the correction clock signal and generate the duty detection signal that represents a duty state of the correction clock signal as a voltage level by comparing levels of the two voltages.
6. The DLL circuit of claim 3, wherein the first delay control signal is implemented as a digital signal of 5 bits or less, and the sub delay control unit is configured to shift locations of bits having a logic value of '1', which are included in the first delay control signal, according to the voltage level of the duty detection signal.
7. The DLL circuit of claim 1, wherein the second feedback loop is configured to generate a feedback clock signal by using a delay acquired by modeling a delay amount generated by delay elements that are provided in an output path of the output clock signal and detect the phase of the reference clock signal by comparing a phase of the feedback clock signal and the phase of the reference clock signal.
8. The DLL circuit of claim 7, wherein the second feedback loop includes:
a main delay line configured to generate a third delay clock signal by delaying the correction clock signal in response to a second delay control signal;
a clock driver configured to generate the output clock signal by driving the third delay clock signal;
a delay compensating unit configured to generate the feedback clock signal by delaying the third delay clock signal by using the delay acquired by modeling the delay amount generated by delay elements that are provided in the output path of the output clock signal;
a phase detecting unit configured to generate a phase detection signal by detecting the phase of the reference clock signal and the phase of the feedback clock signal; and
a main delay control unit configured to control the delay of the main delay line by generating the second delay control signal in response to the phase detection signal.
9. A delay locked loop (DLL) circuit, comprising:
a first sub delay line configured to generate a first delay clock signal by delaying a reference clock signal with a fixed delay;
a second sub delay line configured to generate a second delay clock signal by delaying the reference clock signal with a variable delay for adjusting a duty cycle of the reference clock signal;
a duty cycle correcting unit configured to generate a correction clock signal by combining the first delay clock signal and the second delay clock signal; and
a main delay line configured to generate a third delay clock signal by delaying the correction clock signal with the variable delay for performing a delay locking operation with respect to the correction clock signal.
10. The DLL circuit of claim 9, wherein the duty cycle correcting unit is configured to set a voltage level of the correction clock signal to a first level at a rising edge of the first delay clock signal and set the voltage level of the correction clock signal to a second level at a rising edge of the second delay clock signal.
11. The DLL circuit of claim 9, further comprising:
a duty cycle detecting unit configured to generate a duty detection signal by detecting a duty cycle of the correction clock signal; and
a sub delay control unit configured to control a delay of the second sub delay line by generating a delay control signal in response to the duty detection signal.
12. The DLL circuit of claim 11, wherein the duty cycle detecting unit is configured to generate two voltages corresponding to the duty cycle of the correction clock signal and generate the duty detection signal that represents a duty state of the correction clock signal as a voltage level by comparing levels of the two voltages.

13. The DLL circuit of claim 11, wherein the first delay control signal is implemented as a digital signal of 5 bits or less, and the sub delay control unit is configured to shift locations of bits having a logic value of '1', which are included in the first delay control signal, according to the voltage level of the duty detection signal.

14. The DLL circuit of claim 9, further comprising:

a clock driver configured to generate an output clock signal by driving the third delay clock signal;

a delay compensating unit configured to generate a feedback clock signal by delaying the third delay clock signal by using a delay acquired by modeling a delay amount generated by delay elements that are provided in an output path of an output clock signal;

a phase detecting unit configured to generate a phase detection signal by detecting a phase of reference clock signal and a phase of the feedback clock signal; and a main delay control unit configured to control the delay of the main delay line by generating the delay control signal in response to the phase detection signal.

* * * * *